United States Patent
Zhao et al.

(10) Patent No.: US 7,342,447 B2
(45) Date of Patent: Mar. 11, 2008

(54) SYSTEMS AND METHODS FOR DRIVING AN OUTPUT TRANSISTOR

(75) Inventors: Shifeng Zhao, Plano, TX (US); Cetin Kaya, Plano, TX (US); Sreenath Unnikrishnan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 56 days.

(21) Appl. No.: 11/124,885

(22) Filed: May 9, 2005

(65) Prior Publication Data

US 2006/0250183 A1    Nov. 9, 2006

(51) Int. Cl.
*H03F 3/217* (2006.01)

(52) U.S. Cl. ........................................ 330/251

(58) Field of Classification Search ............... None
See application file for complete search history.

(56) References Cited

U.S. PATENT DOCUMENTS

| | | | | |
|---|---|---|---|---|
| 4,446,440 A | * | 5/1984 | Bell | 330/10 |
| 5,138,177 A | * | 8/1992 | Morgan et al. | 250/551 |
| 6,753,734 B2 | * | 6/2004 | Arell et al. | 330/296 |
| 6,762,614 B2 | * | 7/2004 | Rearick et al. | 324/763 |
| 6,788,150 B2 | * | 9/2004 | Joly et al. | 330/296 |
| 6,859,059 B2 | * | 2/2005 | Rohrbaugh et al. | 324/763 |
| 7,129,740 B2 | * | 10/2006 | Pentakota et al. | 326/31 |

* cited by examiner

*Primary Examiner*—Robert Pascal
*Assistant Examiner*—Krista M Flanagan
(74) *Attorney, Agent, or Firm*—Wade J. Brady, III; Frederick J. Telecky, Jr.

(57) ABSTRACT

A system and method is provided for driving an output transistor. The system and method employ a sense control to adjust a drive strength associated with driving the output transistor. The sense control measures an output parameter of the transistor, and adjusts the drive strength based on the measured parameter. The drive strength can be based on a selected driver of a plurality of driver devices with varying drive strengths or selected output devices of a driver of a plurality of output devices of varying drive strengths. The drive strength of the driver devices or output devices can be varied by varying the channel widths of output drive devices selectively coupled to a drive terminal (e.g., gate, base) of the output transistor.

19 Claims, 3 Drawing Sheets

SYSTEMS AND METHODS FOR DRIVING AN OUTPUT TRANSISTOR

TECHNICAL FIELD

The present invention relates generally to electrical circuits, and more particularly to systems and methods for driving an output transistor.

BACKGROUND

Field effect transistors (FETs) and other transistor types are employed as output devices in many applications, such as amplifiers, power supplies, motor drivers, industrial relays and other applications. These output transistors are usually designed to handle large currents for driving current to respective loads. Associated control circuitry and drive circuitry is employed to switch the output transistors between a conducting "ON" state and a nonconducting "OFF" state. In some applications (e.g., switching amplifiers, switching supplies), the output transistors are switched between a conducting "ON" state and a nonconducting "OFF" state in a continuous manner. This continuous switching can result in certain undesirable effects, such as high inrush currents, voltage spikes, electromagnetic emissions and harmonic distortion. As a result, techniques are employed to mitigate the undesirable effects, sometimes with a tradeoff in performance or reliability. Furthermore, some techniques may mitigate one undesirable effect, while increasing another undesirable effect.

For example, Class D audio amplifiers employ a high-side and low-side power output FET that switch a common node as an output between a high supply rail (e.g., supply voltage) and a low supply rail (e.g., ground) by turning the high-side power output FET and low-side power output FET between opposing "ON" and "OFF" states. The class D audio amplifiers also employ a switching control mechanism and drive circuitry to drive the high-side power output FET and the low-side power output FET "ON" and "OFF". The switching control mechanism and drive circuitry control the turn "ON" time interval and the turn "OFF" time interval for the high-side and low-side power output FET. The switching control mechanism and drive circuitry control also control the blanking time, which is the amount of time that both power output FETs remain "OFF" before one of the power output FETs is turned "ON". This assures that both FETs are not turned "ON" concurrently shorting the high supply rail to the low supply rail.

The reliability of the amplifier system increases with the time interval of the blanking time. However, another critical specification associated with amplifier systems and other switching systems is mitigating harmonic distortion, which is a residual effect that increases with an increase in the time interval of the blanking time. The harmonic distortion can be reduced by driving the high-side and low-side output FET faster during transitions reducing harmonic distortion resulting in a reduced blanking time with reduced reliability. Additionally, driving the high-side and low-side output FET faster at high power levels can result in large voltage spikes on the output damaging either or both the high-side and low-side output FET. Therefore, tradeoffs are made between blanking time, reliability, harmonic distortion, transition speed and potential voltage spikes when designing an amplifier system within specifications resulting in a less than optimal amplifier system.

SUMMARY

In accordance with an aspect of the present invention, a system is provided for driving an output transistor. The system comprises an output transistor and a sense control that selects a drive strength for driving the output transistor based on an output parameter of the output transistor.

In accordance with another aspect of the invention, a switching amplifier system is provided having a high-side output field effect transistor (FET) coupled to a low-side output FET to provide a common output terminal. The system comprises a drive control that provides a high-side drive signal for driving the high-side output FET and a low-side drive signal for driving the low-side output FET between opposing "ON" and "OFF" states. The system further comprises a plurality of high-side driver output devices having different gate drive strengths, a plurality of low-side driver output devices having different gate drive strengths, and a sense control that selects one of the plurality of high-side driver output devices based on a comparison of an output voltage to a reference voltage during an "ON" state of the high-side output FET, and selects one of the plurality of low-side driver output devices based on a comparison of an output voltage to a reference voltage during an "ON" state of the low-side output FET.

In accordance with yet another aspect of the present invention, a method is provided for driving an amplifier system having a high-side output field effect transistor (FET) coupled to a low-side output FET to provide a common output terminal. The method comprises comparing an output voltage at the common output terminal during an "ON" state of the high-side output FET to a reference voltage, and selecting a gate drive strength from a plurality of gate drive strengths for driving the high-side output FET based on the comparison of the output voltage to the reference voltage during the "ON" state of the high-side output FET. The method further comprises comparing an output voltage at the common output terminal during an "ON" state of the low-side output FET to a reference voltage, and selecting a gate drive strength from a plurality of gate drive strengths for driving the low-side output FET based on the comparison of the output voltage to the reference voltage during the "ON" state of the low-side output FET.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

Figure 1:
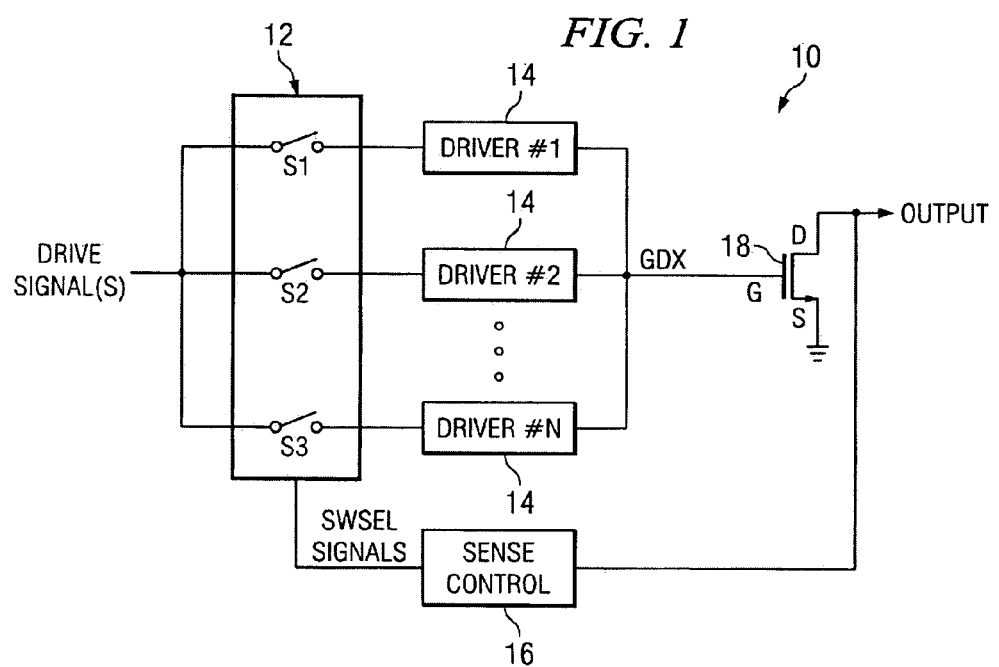
FIG. 1 illustrates a system for driving an output transistor in accordance with an aspect of the present invention.

Systems and methods are provided for driving an output transistor. The systems and methods employ a sense control to adjust a drive strength associated with driving the transistor. The sense control measures an output parameter of the transistor, and adjusts the drive strength based on the measured output parameter. For example, a voltage (e.g., VDS) across the transistor can be measured to determine the output current of the transistor. Alternatively, a current through a matching sense transistor can be employed to determine an output current through the transistor. The output current and an output voltage to a load can be employed to determine the power output of the system. The drive strength can be based on a selected driver of a plurality of driver devices with varying drive strengths or selected output devices of a driver of a plurality of output devices of varying driver strengths. The drive strength of the driver devices or output devices can be varied by varying the channel widths of output drive devices selectively coupled to the gate of the output transistor.

In one aspect of the invention, a device (e.g., a class D audio amplifier) is provided that includes driving a high-side output FET and a low-side output FET between opposing "ON" and "OFF" states. A sense control will adjust the gate drive strength of each of the high-side output FET and low-side output FET to control the blanking time of the device. The blanking time is defined as the time interval in which both the high-side FET and low-side FET remain in an "OFF" state to avoid shorting between a high rail voltage (e.g., supply voltage) coupled to the high-side FET and a low rail voltage (e.g., ground) coupled to the low-side FET. Typically, the longer the blanking time, the more reliable the transition between "OFF" and "ON" states of the high-side FET and the low-side FET. However, this comes with an increase in harmonic distortion. Driving the high-side FET and the low-side FET faster (e.g., with a stronger gate drive) reduces the harmonic distortion, but increases the likelihood of large current spikes on the output, since the voltage spikes at the output are based on the equation:

$$V = L\, di/dt \qquad \text{EQ.1}$$

where V is the voltage on the output, L is the parasitic inductance associated with the output FETs and the conductive line to the load, and di/dt is the change of output current over time. Therefore, large output currents and large changes in output current result in large voltage spikes at the output.

The systems and methods of present invention drive the high-side FET and the low-side FET with a stronger gate drive (e.g., faster) at lower current levels (and lower power levels) to provide a shorter blanking time, where reduction in harmonic distortion is more critical, and drives the high-side FET and the low-side FET with a weaker gate drive (e.g., slower) to provide a longer blanking time to reduce large voltage spikes at the output at higher current levels (and higher power levels). The selecting of gate drives of varying strength results in a variable blanking time, such that a blanking time interval at low power levels is reduced to mitigate harmonic distortion where large voltage spikes are not a factor, and a blanking time interval at high power levels is increased to mitigate large voltage spikes where harmonic distortion is not a factor. Although, the examples in the FIGS. will be illustrated with respect to driving FETs, the present invention is applicable for driving other transistor types (e.g., bipolar junction transistors (BJTs), JFETs).

FIG. 1 illustrates a system 10 for driving an output FET 18 in accordance with an aspect of the present invention. The system 10 can be employed in a switching amplifier, such as a Class D audio amplifier, or a switching supply, such as a buck converter. The system 10 drives the output FET 18 with variable gate drive strength based on an output current of the output FET 18. The system 10 includes a sense control 16 coupled between an output of the output FET and a switching system 12. The system 10 also includes a plurality of drivers 14 labeled driver #1 through driver #N, where N is an integer greater than or equal to two. Each driver 14 has an associated gate drive strength based on the strength of the output drive devices of the respective driver 14. The strength of the output drive devices is based on the channel width associated with one or more output drive devices of a respective driver. For example, the output drive devices can be output drive FETs with a first set of output drive FETs having channel widths that are twice as large as channel widths of a second set of output drive FETs, such that the first set of output drive FETs can drive the output FET from an "OFF" state to an "ON" state faster than the second set of output drive FETs.

A drive signal is provided to a plurality of switches S1-SN associated with the switching system 12. Each of the plurality of switches S1-SN is coupled to an associated driver 14 of the plurality of drivers 1-N. The output of each of the plurality of drivers 1-N is coupled to a gate terminal (CDX) of a gate of the output FET 18. The drain of output FET 18 is illustrated as an output of the system, while the source is illustrated as coupled to ground. In this arrangement, the output FET 18 is configured as a low-side output FET. However, the output FET can have its source coupled to output and drain coupled to a supply voltage, such that the output FET is configured as a high-side output FET.

The sense control 16 determines the output current through the output FET 18 by measuring the output voltage (VDS) of the output FET 18. The voltage (VDS) is then compared to one or more predetermined references voltages to select a desired gate drive strength based on the output voltage (VDS) falling within a respective predetermined reference voltage range. In another aspect of the invention, the sense control includes a matching sense FET having substantially similar gate, drain and source voltages as the output FET 18 to provide a sense current that is a predetermined ratio of the output current of the output FET 18. The sense control 16 then selects a driver gate strength by closing a respective switch of the switching system 12 via SWSEL signals to transmit the drive signals through one of the plurality of drivers 1-N based on the measured output current. The sense control 16 can periodically or continuously monitor the output voltage to determine the respective output current, or measure the sense current of the sense FET and vary the selected gate drive strength by selecting new drivers when the output current falls within a different predetermined reference range.

Figure 2:
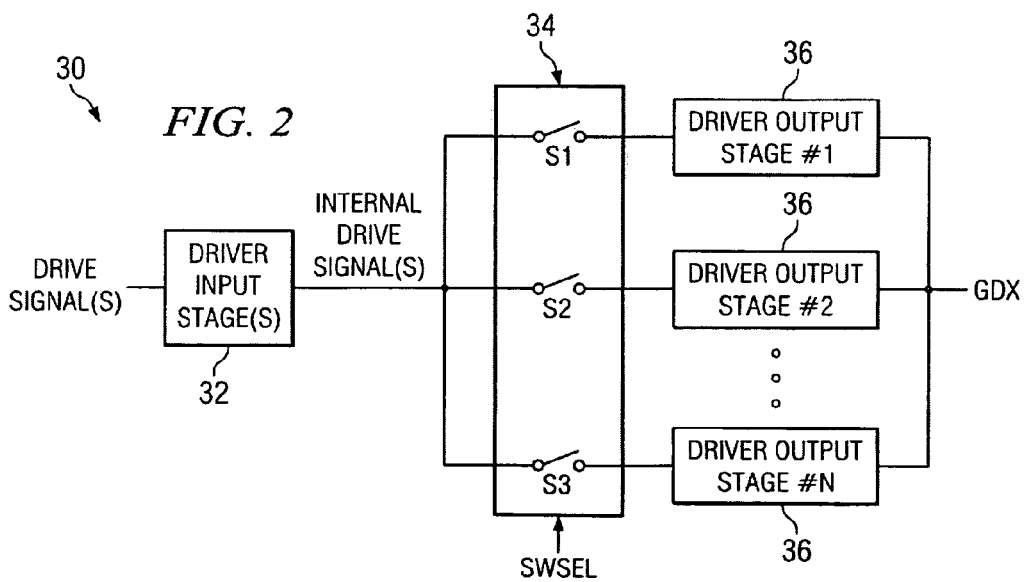
FIG. 2 illustrates an alternate driver system in accordance with an aspect of the present invention.

FIG. 2 illustrates an alternate driver system 30 in accordance with an aspect of the present invention. The driver system 30 includes a driver input stage 32, a switching system 34 and a plurality of driver output stages 36, labeled driver output stage #1 to #N, where N is an integer greater than or equal to two. Each of the plurality of driver output stages 36 includes output drive devices (e.g., output drive FETs) with different gate drive strengths. Each of the driver output stages 36 can include respective output drive FETs of different channel widths, such that selection of a different driver output stage will result in driving the output FET between "OFF" and "ON" states at different gate drive strengths with different transition rates or blanking times. The driver system 30 can be employed to replace the switching system 12 and plurality of drivers 14 of varying strength of FIG. 1 with a reduction of circuitry since each of the selected drivers share a common driver input stage(s) 32.

A drive signal is provided to the driver input stage(s) 32, which provides at its output an internal drive signal(s). The output of the driver input stage(s) 32 is coupled to a plurality of switches S1-SN of the switching system 36, where N is an integer greater than or equal to two. A respective switch S1-SN of the switching system 34 is coupled to an input of a respective driver output stage 36 (1-N). Each output of the plurality driver output stages 36 (1-N) is coupled to a gate drive terminal (GDX) for driving a gate of an output FET (not shown). As previously described in FIG. 1, a sense control determines the output current through the output FET by measuring the output voltage (VDS) of the output FET. The output voltage is then compared to one or more predetermined references voltages to select a desired gate drive strength based on the output falling within a respective predetermined reference voltage range. The sense control then selects a driver gate strength by closing a respective switch S1-SN via SWSEL signals to transmit the internal drive signals through one of the plurality of driver output stages 36 (1-N).

Figure 3:
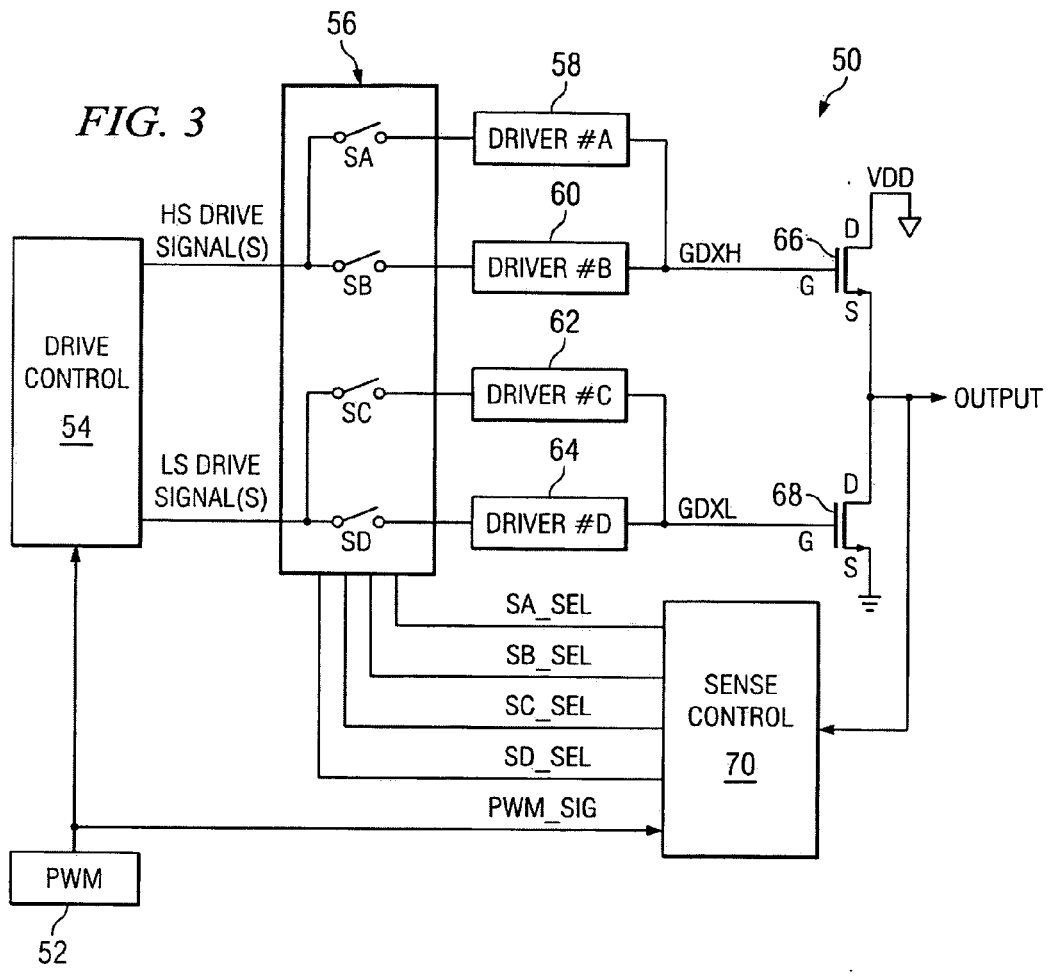
FIG. 3 illustrates a switching amplifier in accordance with an aspect of the present invention.

FIG. 3 illustrates a switching amplifier 50 in accordance with an aspect of the present invention. The switching amplifier 50 can be a class D type audio amplifier or other amplifier system. The amplifier system 50 includes a high-side output FET 66 and a low-side output FET 68. The drain of the high-side output FET 66 is coupled to a supply voltage (VDD), while the source of the low-side output FET 66 is coupled to ground. The source of the high-side output FET 66 is coupled to the drain of the low-side output FET 68 providing an output signal associated with the switching amplifier 50 based on drive signals provided to the gate terminals GDXH and GDXL of the high-side and low-side output FETs 66 and 68. The drive signals switch the high-side and low-side output FETs 66 and 68 between opposing "ON" and "OFF" states, which switches the output between VDD and ground. The output is coupled to a load (not shown).

A pulse width modulator 52 provides a pulse width modulated (PWM) signal to a drive control device 54. The drive control device generates a high-side drive signal or signals, and a low-side drive signal or signals that are inverted versions of one another based on the PWM signal. The high-side drive signal and low-side drive signal toggle between a positive voltage and ground to provide a square wave like pulse. The amount of time that the high-side drive signal and low-side drive signal remain at a positive voltage is based on the duty cycle of the PWM signal.

The switching amplifier 50 also includes a sense control 70 that determines the output current through the high-side output FET 66 and the low-side output FET 68 by measuring the output voltage and comparing the output voltage to a reference voltage associated with the high-side output FET 66 if the high-side output FET 66 is "ON" and conducting or a reference voltage associated with the low-side output FET 68 if the low-side output FET 68 is "ON" and conducting. Additionally, a single reference voltage can be employed for comparing the output voltage associated with the high-side output FET 66 and the low-side output FET 68. The sense control 70 determines which output FET is being compared to its respective reference voltage employing the PWM signal. The state of the PWM signal is reflective of which of the output FETs is "ON" and which of the output FETs are "OFF". The sense control 70 selects a desired gate drive strength for the high-side output FET 66 based on the high-side output FET comparison during the "ON" state of the high-side output FET 66, and the sense control 70 selects a desired gate drive strength for the low-side output FET 68 based on the low-side output FET comparison during the "ON" state of the low-side output FET 68.

The sense control 70 is coupled to a switching system 56 having switches SA and SB coupled to driver A 58 and driver B 60, respectively, and having switches SC and SD coupled to driver C 62 and driver D 64, respectively. The switches SA and SB are operative to provide the high-side drive signal to driver A 58 or driver B 60, respectively, and the switches SC and SD are operative to provide the low-side drive signal to driver C 62 and driver D 64, respectively. The sense control 70 selects a driver gate strength for the high-side output FET by closing either switch SA or switch SB via signal SA_SEL or SB_SEL based on the reference voltage comparison for the high-side output FET, which routes the high-side drive signal through the selected driver to the gate terminal of the high-side output FET 66. The sense control 70 selects a driver gate strength for the low-side output FET by closing either switch SC or switch SD via signal SC_SEL or SD_SEL based on the reference voltage comparison for the low-side output FET 68, which routes the low-side drive signal through the selected driver to the gate terminal of the low-side output FET 68.

Figure 4:
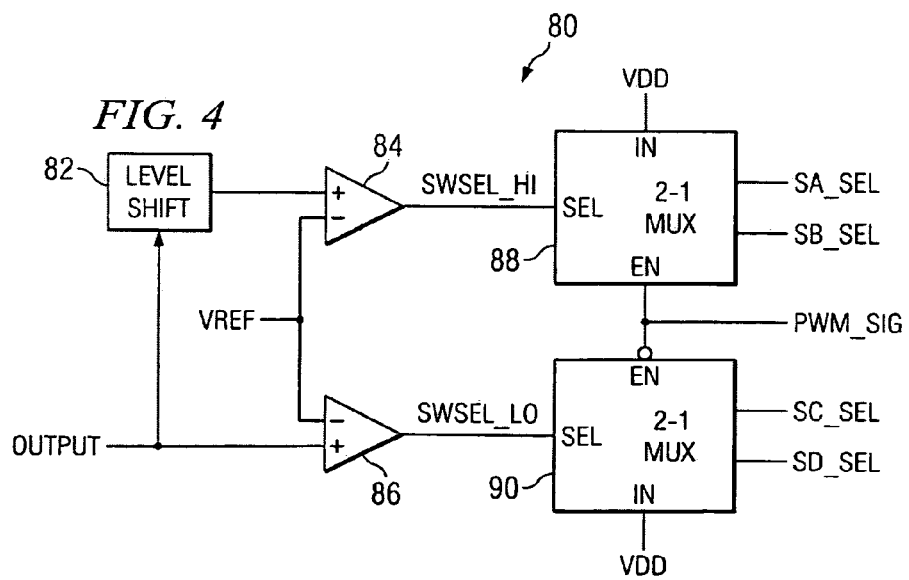
FIG. 4 illustrates a sense control system in accordance with an aspect of the present invention.

FIG. 4 illustrates a sense control system 80 in accordance with an aspect of the present invention. The sense control system 80 receives an output signal associated with a switching amplifier output that is provided to a positive terminal of a first comparator 84 through a level shifter 82 and a positive terminal of a second comparator 86. The level shifter 82 shifts the output signal voltage from the supply domain to the ground domain for comparing to a reference voltage VREF that is in the ground domain. The reference voltage is provided to negative terminals of both the first comparator 84 and the second comparator 86. The first comparator 84 provides a high-side drive select signal SWSEL_HI to a select line of a first two-one multiplexer 88, and the second comparator 86 provides a low-side drive select signal SWSEL_LO to a select line of a second two-one multiplexer 90. The PWM signal is coupled to an enable line of the first multiplexer 88 and an inverted enable line of the second multiplexer 90, such that one of the multiplexers can be selected at any given time. Therefore, when the PWM signal is high, the high-side output FET is "ON" and the first multiplexer 88 is enabled, and the second multiplexer 90 is disabled. Also, when the PWM signal is low, the low-side driver is "ON" and the second multiplexer 90 is enabled, and the first multiplexer 88 is disabled.

If the output signal is below VREF and the PWM signal is high, the high-side select signal will be a logic low, routing VDD from the input of the first multiplexer 88 to the switch SA_SEL signal line to close switch SA, thus selecting driver A of a first gate drive strength for driving the high-side output FET. If the output signal is above VREF and the PWM signal is high, the high-side select signal will be high, routing VDD from the input of the first multiplexer 88 to the switch SB_SEL signal line to close switch SB, thus selecting driver B of a second gate drive strength for driving the high-side output FET, where the first gate drive strength is greater than the second gate drive strength. Additionally, If the output signal is below VREF and the PWM signal is low, the low-side select signal will be low, routing VDD from the input of the second multiplexer 90 to the switch SC_SEL signal line to close switch SC, thus selecting driver C of a third gate drive strength for driving the low-side output FET. If the output signal is above VREF and the PWM signal is low, the low-side select signal will be high, routing VDD from the input of the second multiplexer 90 to the switch SD_SEL signal line to close switch SD, thus selecting driver D of a fourth gate drive strength for driving the low-side output FET, where the third gate drive strength is greater than the fourth gate drive strength.

Therefore, the sense control system 80 is operative to select stronger drivers to turn the high-side and low-side output FETs "ON" faster at low output currents to reduce the blanking time and harmonic distortion. Additionally, the sense control system 80 is operative to select weaker drivers to turn the high-side and low-side output FETs "ON" slower at high output currents to increase the blanking time and reduce potential voltage spikes. It is to be appreciated that the sense control system 80 is for illustrative purposes, and a variety of other circuit designs can be employed to provide the desired functionality.

Figure 5:
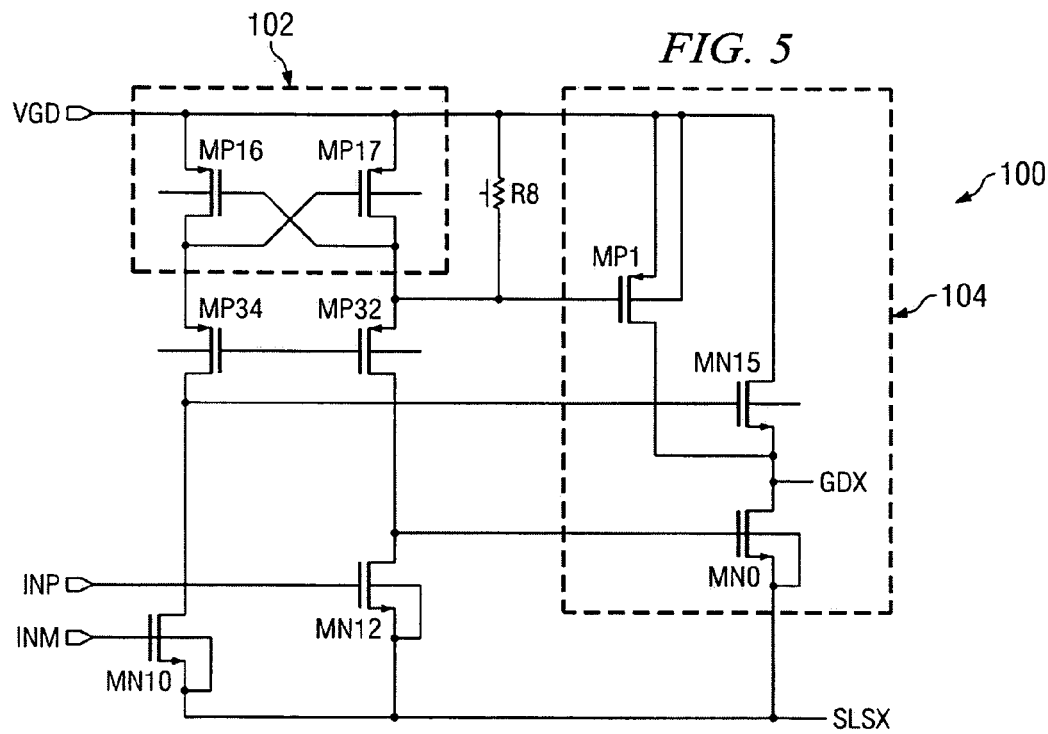
FIG. 5 illustrates a drive output stage in accordance with an aspect of the present invention.

FIG. 5 illustrates a drive output stage 100 in accordance with an aspect of the present invention. The drive output stage 100 includes a first n-type drive FET MN12 coupled to a first differential input pin (INP) and a second n-type drive FET MN10 coupled to a second differential input pin (INM). The first n-type drive FET MN12 has its drain coupled to a first p-type FET MP17 of a latch device 102 through a first p-type cascode FET MP32, and the second n-type drive FET MN10 is coupled to a second p-type FET MP16 of the latch device 102 through a second p-type cascode FET MP34. The first p-type FET MP17 and the second p-type FET MP16 of the latch device 102 are coupled to a gate drive supply voltage (VGD) and facilitate the switching speed for pulling up and down a p-type pull up FET MP1, and n-type pull up FET MN15 and a n-type pull down FET MN0.

A gate of the p-type pull up FET MP1 is coupled between the first p-type FET MP17 of the latch device 62 and the first p-type cascode FET MP32. A resistor R8 is coupled between the gate drive supply voltage (VGD) and the gate of the p-type pull up FET MP1. The p-type pull up FET MP1 is coupled to the gate drive supply voltage (VGD) at its source and a gate drive terminal (GDX) at its drain. The n-type pull up FET MP15 is coupled to the gate drive supply voltage (VGD) at its drain and the gate drive terminal (GDX) at its source with its gate coupled between the second n-type drive FET MN10 and the second p-type cascode FET MP34. The n-type pull down FET MN0 is coupled to a source drive terminal (SLSX) at its source and to the gate drive terminal (GDX) at its drain.

The p-type pull up FET MP1, the n-type pull up FET MN15 and the n-type pull down FET MN0 form driver output devices 104 of the output stage 100. The p-type pull up FET MP1, and the n-type pull up FET MN15 cooperate to pull the gate of the output FET to an "ON" state, while the n-type pull down FET MN0 pulls the gate of the output FET to an "OFF" state based on the state of the differential input signal INP and INM. The channel widths of the p-type pull up FET MP1, the n-type pull up FET MN15 and the n-type pull down FET MN0 are varied for each driver or driver output stage to provide drivers with varying gate strengths.

Figure 6:
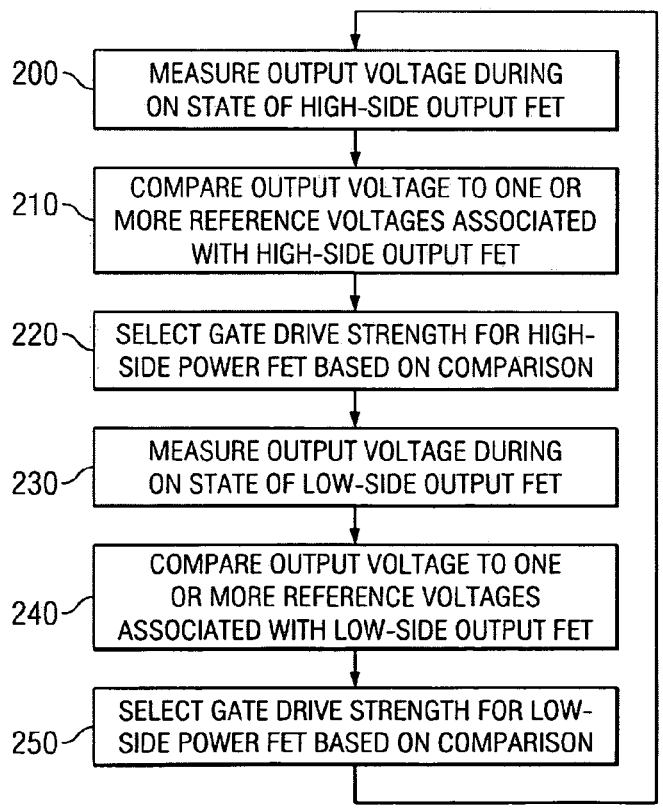
FIG. 6 illustrates a methodology for driving an amplifier system in accordance with an aspect of the present invention.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates a methodology for driving an amplifier system having a high-side output field effect transistor (FET) coupled to a low-side output FET to provide a common output terminal. The methodology begins at 200. At 200, an output voltage is measured during an "ON" state of the high-side output FET. The output voltage can be employed to determine the VDS across the high-side output FET, and the corresponding output current. At 210, the measured output voltage is then compared to one or more reference voltages associated with the high-side output FET. At 220, a gate drive strength is selected for the high-side power FET based on the comparison. The gate drive strength can be selected by selecting output drive devices that have a given gate drive strength based on channel widths associated with the selected output devices. The methodology then proceeds to 230.

At 230, an output voltage is measured during an "ON" state of the low-side output FET. The output voltage can be employed to determine the VDS across the low-side output FET, and the corresponding output current. At 240, the measured output voltage is then compared to one or more reference voltages associated with the low-side output FET. At 250, a gate drive strength is selected for the low-side power FET based on the comparison. The gate drive strength can be selected by selecting output drive devices that have a given gate drive strength based on channel widths associated with the selected output devices. The reference voltages associated with the high-side power FETs and the low-side power FETs can be different, or the same. If the references voltages are the same, the measured output voltage for the high-side power FET needs to be level shifted to the ground domain or the measured output voltage of the low-side power FET needs to be level shifted to the supply domain based on which domain the reference voltages reside. The methodology then returns to 200 to repeat the process.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A system for driving an output transistor, the system comprising:
   an output transistor; and
   a sense control that selects a drive strength for driving the output transistor based on an output parameter of the output transistor;
   wherein the sense control comprises a sense transistor that is subjected to substantially the same voltages as the output transistor to generate a sense current that is based on a predetermined ratio of an output current of the output transistor, the sense control selects the drive strength based on the sense current of the sense transistor.

2. A system for driving an output transistor, the system comprising:
an output transistor; and
a sense control that selects a drive strength for driving the output transistor based on an output parameter of the output transistor;
wherein the sense control compares an output voltage to at least one reference voltage, and select the drive strength based on the comparison.

3. The system of claim 2, further comprising a plurality of drivers having different drive strengths, wherein the sense control selects one of the drivers based on the comparison to drive the output transistor.

4. The system of claim 3, further comprising a switching system having a plurality of switches, the sense control closing a switch coupled to a selected driver based on the comparison to select the drive strength.

5. The system of claim 2, further comprising at least one input driver stage and a plurality of driver output stages having different drive strengths, wherein the sense control selects one of the driver output stages based on the comparison to drive the output transistor.

6. The system of claim 5, further comprising a switching system having a plurality of switches, the sense control closing a switch coupled to a selected driver output stage based on the comparison to select a drive strength.

7. A system for driving an output transistor, the system comprising:
an output transistor; and
a sense control that selects a drive strength for driving the output transistor based on an output parameter of the output transistor;
wherein the output transistor is one of a high-side output transistor and a low-side output transistor, and further comprising a second output transistor that is the other of a high-side output transistor and a low-side output transistor, the sense control selecting a drive strength for both the high-side output transistor and a low-side output transistor.

8. The system of claim 7, further comprising a plurality of high-side drivers having different drive strengths associated with the high-side output transistor, and a plurality of low-side drivers having different drive strengths associated with the low-side output transistor, wherein the sense control selects one of the plurality of high-side drivers based on a comparison of an output voltage to a reference voltage during an "ON" state of the high-side output transistor, and the sense control selects one of the plurality of low-side drivers based on a comparison of an output voltage to a reference voltage during an "ON" state of the low-side output transistor.

9. The system of claim 8, wherein output drive devices of the plurality of high-side drivers have different channel widths to provide different drive strengths associated with the high-side output transistor, and output drive devices of the plurality of low-side drivers have different channel widths to provide different drive strengths associated with the low-side output transistor.

10. A switching amplifier system having a high-side output field effect transistor (FET) coupled to a low-side output FET to provide a common output terminal, the system comprising:
a drive control that provides a high-side drive signal for driving the high-side output FET and a low-side drive signal for driving the low-side output FET between opposing "ON" and "OFF" states;
a plurality of high-side driver output devices having different gate drive strengths;
a plurality of low-side driver output devices having different gate drive strengths; and
a sense control that selects one of the plurality of high-side driver output devices based on a comparison of an output voltage to a reference voltage during an "ON" state of the high-side output transistor, and selects one of the plurality of low-side driver output devices based on a comparison of an output voltage to a reference voltage during an "ON" state of the low-side output transistor.

11. The system of claim 10, further comprising at least one high-side driver input stage wherein the plurality of high-side driver output devices of varying gate drive strengths reside in different high-side output stages and at least one low-side driver input stage wherein the plurality of low-side driver output devices of varying gate drive strengths reside in different low-side output stages.

12. The system of claim 10, wherein the sense control selects high-side driver output devices of a first gate drive strength if the output voltage is below the reference voltage and high-side driver output devices of a second gate drive strength if the output voltage is above the reference voltage during an "ON" state of the high-side output FET, wherein the first gate drive strength is greater than the second gate drive strength, and the sense control selects low-side driver output devices of a third gate drive strength if the output voltage is below the reference voltage and low-side driver output devices of a fourth gate drive strength if the output voltage is above the reference voltage during an "ON" state of the low-side output FET, wherein the third gate drive strength is greater than the fourth gate drive strength.

13. The system of claim 10, wherein selecting driver output devices of varying gate drive strengths for the high-side output FET and the low-side output FET vary the blanking time associated with the transitioning of the high-side output FET and the low-side output FET from an "OFF" state to an "ON" state to reduce harmonic distortions at low output currents and to reduce voltage spikes at high output currents.

14. The system of claim 10, wherein the output drive devices of different gate drive strengths associated with the high-side output FET have different channel widths, and output drive devices of different gate drive strengths associated with the low-side output FET have different channel widths.

15. The system of claim 10, wherein the sense control comprises:
a first comparator for comparing an output voltage associated with an "ON" state of the high-side output FET to a reference voltage;
a second comparator for comparing an output voltage associated with an "ON" state of the low-side output FET to a reference voltage;
a level shifter for shifting the output voltage associated with an "ON" state of one of the high-side output FET and the low-side output FET from a first domain to a second domain associated with a reference voltage corresponding to one of the high-side output FET and the low-side output FET;
a first multiplexer for selecting driver output devices from the plurality of high-side driver output devices based on an output of the first comparator; and
a second multiplexer for selecting driver output devices from the plurality of low-side driver output devices based on an output of the second comparator.

16. The system of claim 15, wherein the first multiplexer and second multiplexer are enabled in opposing "ON" and "OFF" states based on a pulse width modulated signal provided to the sense control and the drive control.

17. The system of claim 15, further comprising a switching system having a first set of switches coupled to the plurality of high-side driver output devices and a second set of switches coupled to the plurality of low-side driver output devices, wherein a switch is closed from the first set of switches based on the outputs of the first multiplexer for selecting driver output devices from the plurality of high-side driver output devices, and a switch is closed from the second set of switches based on the outputs of the second multiplexer for selecting driver output devices from the plurality of low-side driver output devices.

18. A method for driving an amplifier system having a high-side output field effect transistor (FET) coupled to a low-side output FET to provide a common output terminal, the method comprising:

comparing an output voltage at the common output terminal during an "ON" state of the high-side output FET to a reference voltage;

selecting a gate drive strength from a plurality of gate drive strengths for driving the high-side output FET based on the comparison of the output voltage to the reference voltage during the "ON" state of the high-side output FET;

comparing an output voltage at the common output terminal during an "ON" state of the low-side output FET to a reference voltage; and selecting a gate drive strength from a plurality of gate drive strengths for driving the low-side output FET based on the comparison of the output voltage to the reference voltage during the "ON" state of the low-side output FET.

19. The method of claim 18, further comprising varying a blanking time associated with transitioning of the high-side output FET and the low-side output FET from an "OFF" state to an "ON" state to reduce harmonic distortions at low output currents by selecting gate drives of a first gate drive strength and reduce voltage spikes at high output currents by selecting gate drives of a second gate drive strength, wherein the first gate drive strength is greater than the second gate drive strength.

* * * * *